(12) United States Patent
Koller et al.

(10) Patent No.: US 9,722,283 B2
(45) Date of Patent: Aug. 1, 2017

(54) USING EFFECTIVE C-RATES TO DETERMINE INACCESSIBLE CAPACITIES OF BATTERIES

(71) Applicant: Apple Inc., Cupertino, CA (US)

(72) Inventors: Jeffrey G. Koller, Oxnard, CA (US); Nils E. Mattisson, San Francisco, CA (US); Thomas C. Greening, San Jose, CA (US); P. Jeffrey Ungar, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 589 days.

(21) Appl. No.: 14/184,167

(22) Filed: Feb. 19, 2014

(65) Prior Publication Data

US 2015/0236383 A1 Aug. 20, 2015

(51) Int. Cl.
*H02J 7/00* (2006.01)
*H01M 10/48* (2006.01)
*H01M 10/42* (2006.01)
*G01R 31/36* (2006.01)

(52) U.S. Cl.
CPC ........ *H01M 10/48* (2013.01); *G01R 31/3651* (2013.01); *G01R 31/361* (2013.01); *G01R 31/3675* (2013.01); *H01M 2010/4271* (2013.01); *H01M 2220/30* (2013.01)

(58) Field of Classification Search
CPC .. H02J 7/0008; H02J 7/04; H02J 7/007; H02J 11/1857; G01R 31/3673; G01R 31/3675; G01R 31/3679; G01R 31/361; H01M 2010/4271; H01M 2220/30; H01M 10/44; H01M 10/443
USPC .......................................... 716/132, 161–162
See application file for complete search history.

(56) References Cited

U.S. PATENT DOCUMENTS

| 5,955,869 A * | 9/1999 | Rathmann .......... G01R 31/3648 320/132 |
| 2010/0045240 A1* | 2/2010 | Bergveld .......... G01R 31/3651 320/132 |
| 2011/0017528 A1* | 1/2011 | Kumar .................. H01M 4/366 180/65.1 |

* cited by examiner

*Primary Examiner* — Paul Dinh
(74) *Attorney, Agent, or Firm* — Blank Rome LLP

(57) ABSTRACT

The disclosed embodiments provide a system that manages use of a battery in a portable electronic device. During operation, the system obtains a voltage of the battery and a state-of-charge of the battery and calculates an effective C-rate of the battery using the voltage and the state-of-charge. Next, the system uses the effective C-rate to estimate an inaccessible capacity of the battery. Finally, the system manages use of the battery with the portable electronic device based on the inaccessible capacity.

20 Claims, 13 Drawing Sheets

```
static vector t[0:90];      % angular grid
static vector c[1:5];       % reference c-rates, including Cmax
static matrix r[0:90,1:5];  % r values of reference curves
function ceff = cqv(q,v)
    vector rtemp[1:5];
    % restrict q and v to the first quadrant
    % by freezing them at safe values.
    if (q > 1) q = 1;
    if (v < 3.0) v = 3.0;
    % convert to rho and theta
    (rho,theta) = cart2pol(1-q, (v - 3.0)/1.2);
    % first interpolate each reference curve to this angle.
    for j=1:5
        rtemp[j] = interpolate(t[:], r[:,j], theta);
    end
    % now interpolate in the r direction
    % if outside the OCV curve, just extrapolate linearly,
    % otherwise interpolate using a safe spline
    if (rho > rtemp[1])
        ceff = linear_extrapolate(rtemp[:], c[:], rho);
    else
        ceff = spline_interpolate(rtemp[:], c[:], rho);
    end
end
function b = bc(ceff)
    % the 3.0V line is just the theta = 0 axis
    if (ceff < 0)
        b = 1 - linear_extrapolate(c[:],r[0,:],ceff);
    else
        b = 1 - spline_interpolate(c[:],r[0,:],ceff);
    end
end
```

FIG. 6

```
qhib;      // hibernation allowance (e.g., 0.03)
nb;        // number of mileposts to use (e.g. 32+1)
qb;        // array of nb milepost values (q-values)
yb;        // array of nb milepost values (instantaneous reserve values)
ib;        // array of nb milepost counts (zero means this milepost unused)
a;         // an IIR filtering/averaging coefficient
qf;        // most recent filtered q-value
yf;        // most recent filtered instantaneous reserve value
lastq;     // last sample's q-value
lasty;     // last sample's reserve value
trail;     // LIFO data structure with milepost numbers traversed in the current discharge
halfwidth; // a window-size in q defining each milepost's extent; e.g.,
           // one may be centered at 0.680 and be allocated to a small interval
           // 0.680-halfwidth to 0.680+halfwidth
```

FIG. 7A

```
inputs:
quint; // state of charge at beginning of discharge
// set filter coefficient (T = 60 samples = 60 seconds, typical).
a = exp(-1/T);
// set up mileposts
// typical to use 32 equal intervals, so 33 points
nb = 33;
zero out ib array;
// load starting value
lastq = qinit;
lasty = 0;
qf = qinit;
yf = 0;
// initialize empty trail to start
make empty trail LIFO
```

FIG. 7B

```
inputs:
q; // state of charge
y; // instantaneous reserve

// record this sample's values
lastq = q;
lasty = y;
// sum them into the IIR averaging filters
qf = qf*a + q*(1-a);
yf = yf*a + y*(1-a);
Find nearest milepost. Call it mp.
If within nearest milepost's halfwidth
    // record filtered values
    ++ib[mp];
    qb[mp] = qf;
    yb[mp] = yf;
    if trail is empty or top of trail is not this milepost
        push this mp onto trail
    endif
endif
```

FIG. 7C

```
inputs:
maxq; // maximum q-distance to look back in the history trail ip = list of mileposts in trail within maxq of lastq;
// use points to define a line, slope m and point (qf,y0)
//
if ip is empty
    // no history, so just use most recent filtered values
    slope m = 0;
    starting y0 = yf;
elseif ip has one milepost
    // use this and most recent filtered value to define a line
    let mp = first and only ip value
    slope m = (yf - yb[mp])/(qf - qb[mp]);
    starting y0 = yf;
else
    // three or more points so fit a line
    set x = array with qf followed by all qb[ip];
    set y = array with yf followed by all yb[ip];
    set s = number of points (3 or more);
    set sx = sum of all x[i];
    set sx2 = sum of all x[i]^2;
    set sxy = sum of all x[i]*y[i];
    set sy = sum of all y[i];
    set det = s*sx2 - sx*sx;
    slope m = (s*sxy-sx*sy)/det;
    intercept b = (sx2*sy - sx*sxy)/det;
    starting y0 = m*qf + b;
endif
// be conservative: only allow slopes that would tend to
// increase the predicted reserve value
if m<0
    m = 0
endif
// find where line intersects y = q
q3 = (y0 - m*qf)/(1 - m);
if qf-q3 > maxq
    // predicted value is more than maxq away from our present qf.
    // don't extrapolate forward further than we looked back.
    y3 = m*(-maxq)+y0;
else
    // close enough to here so use it
    y3 = q3;
end
return y3 + qhib
```

FIG. 7D

USING EFFECTIVE C-RATES TO DETERMINE INACCESSIBLE CAPACITIES OF BATTERIES

BACKGROUND

Field

The disclosed embodiments relate to batteries for portable electronic devices. More specifically, the disclosed embodiments relate to techniques for using effective C-rates to determine inaccessible capacities of batteries for portable electronic devices.

Related Art

A lithium-ion and/or lithium-polymer battery cell is defined to be fully charged when it is at rest with a voltage of 4.2 V across the terminals. Likewise, the battery cell is defined as fully discharged when it is at rest and the voltage is 3.0 V. The chemical capacity of the cell, called $Q_{max}$, is defined as the amount of charge that needs to flow through the terminals to take it from the fully charged state to the fully discharged state. In principle, it would take an infinite amount of time to measure the chemical capacity exactly, since the cell would take an exponentially long time to come to rest. An equivalent definition is that $Q_{max}$ is the amount of charge that flows through the terminals when the voltage is brought from 4.2 V to 3.0 V, using an infinitely small current.

It has been known for over a century that if a realistic, non-zero current is used to discharge any kind of battery cell, the amount of charge available in going from the full-state voltage to the empty-state voltage is less than the idealized value $Q_{max}$. In general, this actually available capacity decreases as the current increases. For lead acid batteries, this capacity loss has been quantified, and is known as Peukert's Law.

For lithium-ion and/or lithium-polymer cells used in portable computers, it is important to be able to estimate this capacity loss, because the computer needs to be able to estimate when the battery will be nearly empty, so that it can save data and shut down safely. The lost capacity, known as the inaccessible capacity, typically amounts to about 3% to 10% of the battery capacity, so for a battery that lasts 2 hours, this makes a difference of about 10 minutes in the run time, which is significant; misjudging the reserve can lead to data loss. Unfortunately, there is no simple quantitative expression for the capacity loss of a lithium-ion cell, and in any case, the current is rarely constant in a modern portable computer, so any such expression would have to take dynamic effects into account.

Approaches to this problem have typically involved taking a simple model of the lithium-ion battery, fitting the model to some measured data to extract parameters, and then solving some equations to estimate the inaccessible capacity for any particular system current. In addition to dealing with the fact that any simple model is wrong, an added complication is that the parameters may need to change as the battery ages, or temperatures change, so some way is needed to continually adapt the parameters to the changing conditions. With this approach, it is in the end very hard to see how accurate the inaccessible capacity estimate actually is, and there is often the danger that continual parameter updates will end up walking the model into some obscure corner of the parameter space, where it gets trapped.

Hence, what is needed is a mechanism for adapting an inaccessible capacity estimate of a battery to changing conditions associated with use of the battery.

SUMMARY

The disclosed embodiments provide a system that manages use of a battery in a portable electronic device. During operation, the system obtains a voltage of the battery and a state-of-charge of the battery and calculates an effective C-rate of the battery using the voltage and the state-of-charge. Next, the system uses the effective C-rate to estimate an inaccessible capacity of the battery. Finally, the system manages use of the battery with the portable electronic device based on the inaccessible capacity.

In some embodiments, calculating the effective C-rate of the battery using the voltage and the state-of-charge involves obtaining a set of constant-current curves for a characterized behavior of the battery, and interpolating the effective C-rate for the voltage and the state-of-charge from the set of constant-current curves.

In some embodiments, the set of constant-current curves includes one or more charge curves and/or one or more discharge curves.

In some embodiments, using the effective C-rate to estimate the inaccessible capacity of the battery involves identifying, from the one or more discharge curves, a discharge curve for the effective C-rate, and calculating a value of the inaccessible capacity as the state-of-charge corresponding to an intersection of the discharge curve with a discharge-termination voltage of the battery.

In some embodiments, using the effective C-rate to estimate the inaccessible capacity of the battery further involves:
 (i) tracking the value of the inaccessible capacity during use of the battery with the portable electronic device;
 (ii) extrapolating a trend in the value; and
 (iii) updating the estimated inaccessible capacity based on the trend.

In some embodiments, updating the estimated inaccessible capacity based on the trend involves at least one of:
 (i) including the trend in the estimated inaccessible capacity if the trend increases the value of the inaccessible capacity;
 (ii) increasing the estimated inaccessible capacity after the trend is included; and
 (iii) increasing the estimated inaccessible capacity independently of the trend.

In some embodiments, the estimated inaccessible capacity is increased by at least one of:
 (i) a hibernation allowance;
 (ii) a predefined value;
 (iii) a slope associated with the trend; and
 (iv) a modification to the slope.

In some embodiments, managing use of the battery with the portable electronic device based on the inaccessible capacity involves at least one of reporting the state-of-charge to a user of the portable electronic device based on the inaccessible capacity, and using the inaccessible capacity to provide an upper limit on the effective C-rate to the portable electronic device. For example, the state-of-charge may be scaled down based on the inaccessible capacity.

BRIEF DESCRIPTION OF THE FIGURES

FIG. 6 shows an exemplary technique for calculating an inaccessible capacity of a battery in accordance with the disclosed embodiments.

FIG. 7A shows an exemplary set of data for estimating an inaccessible capacity in accordance with the disclosed embodiments.

FIG. 7B shows an exemplary initialization of a technique for estimating an inaccessible capacity in accordance with the disclosed embodiments.

FIG. 7C shows the extrapolation of a trend in a value of an inaccessible capacity in accordance with the disclosed embodiments.

FIG. 7D shows the updating of an estimated inaccessible capacity in accordance with the disclosed embodiments.

In the figures, like reference numerals refer to the same figure elements.

DETAILED DESCRIPTION

Figure 1:
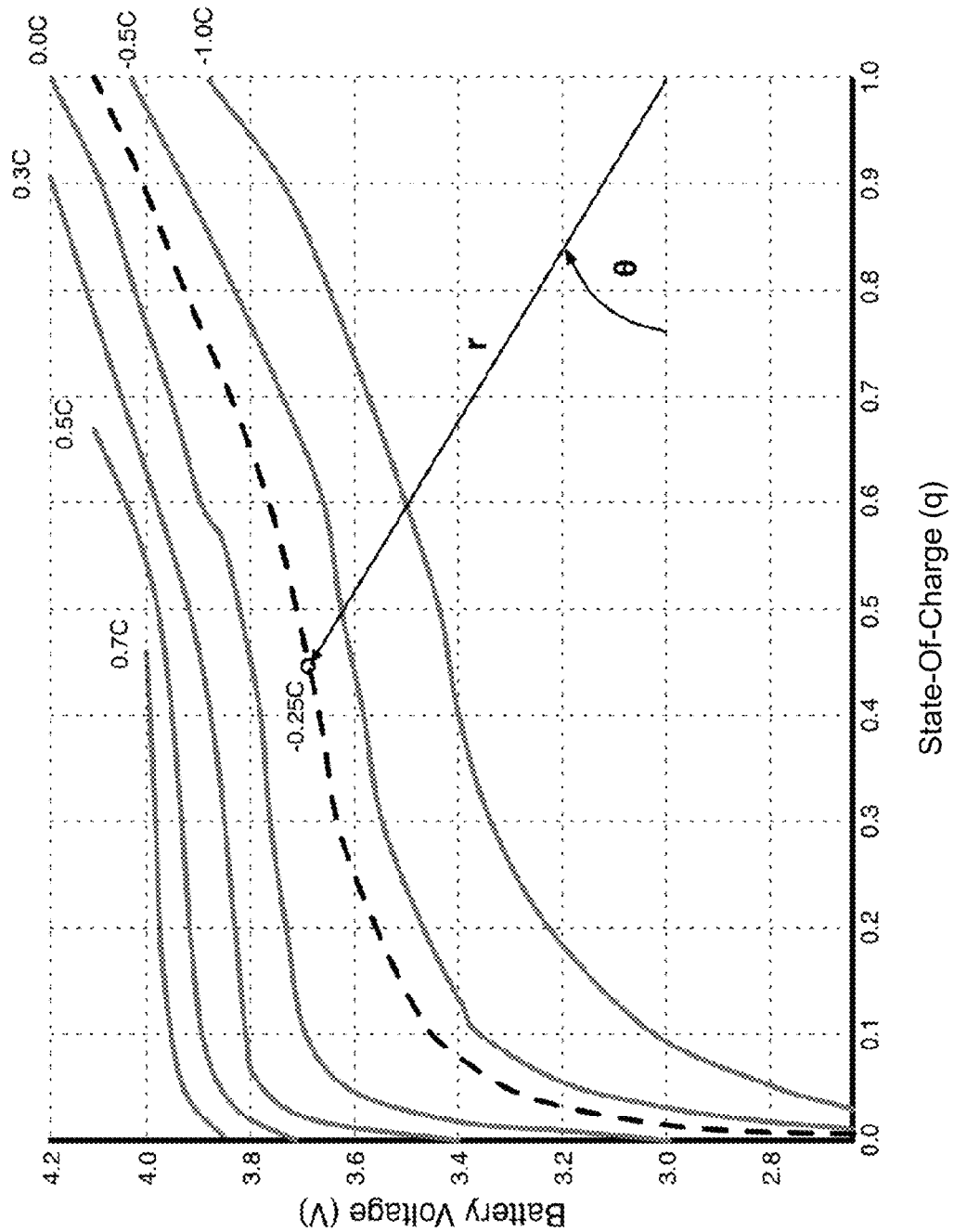
FIG. 1 shows the interpolation of a constant-current curve from a set of constant-current curves in accordance with the disclosed embodiments.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

The disclosed embodiments provide a method and system for managing use of a battery in a portable electronic device. The battery may include one or more cells in a parallel and/or series configuration and supply power to a mobile phone, laptop computer, portable media player, tablet computer, and/or other battery-powered electronic device. For example, the battery may correspond to a lithium-ion battery and/or lithium-polymer battery.

More specifically, the disclosed embodiments provide a method and system for estimating an inaccessible capacity of the battery, which may vary based on the battery's current. During discharge of the battery, the inaccessible capacity may be estimated continuously for each bank and reported based on the assumption that future power requirements and conditions are predictable from recent power requirements and conditions. The estimate may also be updated to reflect changes in these requirements and conditions.

The reserve capacity estimate R(t) for a bank at time t can be combined with the bank $Q_{max}$ to obtain the full charge capacity (FCC), the remaining capacity (RC), and the relative state-of-charge (RSOC) for the bank.

The per-bank values should be combined into pack values, using a combination rule appropriate for the type of balancer running on the pack.

In one or more embodiments, the inaccessible capacity is estimated using an effective C-rate of the battery. The effective C-rate for each bank in a battery pack $C_{\mathit{eff},b}$ is calculated from the bank's state-of-charge $q_b$ and the bank voltage $V_b$, and corresponds to the constant charge or discharge current of a typical un-aged battery at 25° C. with the same state-of-charge and bank voltage.

The state-of-charge of a battery is defined as the fraction of the remaining charge in a battery between a top voltage at rest (e.g., 4.2 V at 25° C.) and a bottom voltage at rest (e.g., 3.0 V at 25° C.). Typically, the state-of-charge q is calculated as the change in the coulomb count ΔQ measured by a sense resistor divided by the maximum capacity of the battery $Q_{max}$ since the state-of-charge at the last rest measurement $q_{rest}$.

$$q = q_{rest} + \frac{\Delta Q}{Q_{max}} \quad (1)$$

For a fully relaxed battery cell, a pre-characterized look up table can be used to correlate the open circuit voltage to the battery's state-of-charge. The coulomb count ΔQ is typically measured as the time integrated current measured by the battery since the last rest measurement. The maximum battery capacity $Q_{max}$ is typically measured by the ratio of the coulomb count between two separated rest measurements.

$$Q_{max} = \frac{\Delta Q_{AB}}{q_{rest,A} - q_{rest,B}} \quad (2)$$

The calculation of the effective C-rate depends on pre-characterized constant current charge and discharge curves for a typical battery cell at 25° C. FIG. 1 shows the pre-characterized constant-current curves for six different C-rates plotted as a function of the voltage V and state-of-charge q.

In addition to the measured constant-current curves, one more curve at the extreme point (V=3.0 V and q=1.0) is available. The C-rate of this curve is calculated as the linear interpolation along the q=1.0 axis. The corresponding C-rate for this extreme C-rate curve is called $C_{max}$ and for the data in FIG. 1 has the value of 3.74 C.

The effective C-rate is found by using the pre-characterized constant-current curves to find which interpolated constant-current curve (dashed curve at −0.25 C in FIG. 1) intersects the measured bank voltage $V_b$ and state-of-charge $q_b$ (shown as the circle at $V_b$=3.7 V and $q_b$=0.45).

Interpolation by holding q fixed and interpolating in the V direction can be problematic at low q values because the curves are nearly vertical. Similarly, interpolation by holding V fixed and interpolating in the q direction is problematic in regions where the curves are nearly horizontal.

An interpolation method that works well transforms the constant C-rate curves into polar coordinates centered at $V_b$=3.0 V and $q_b$=1.0. The voltage $V_b$ is first scaled to variable y that ranges from 0 to 1 as the voltage ranges from 3.0 to 4.2 V.

$$y = \frac{V_b - 3.0}{1.2} \quad (3)$$

The state-of-charge $q_b$ is transformed as the distance x from q=1.0.

$$x = 1.0 - q_b \quad (4)$$

The polar coordinates $r_b$ and $\theta_b$ for the measured voltage $V_b$ and state-of-charge $q_b$ are given by:

$$r_b = \sqrt{x^2 + y^2} \quad (5)$$

and $$\theta_b = \arctan\left(\frac{y}{x}\right). \quad (6)$$

For the exemplary point given in FIG. 1 with a voltage $V_b$ of 3.7 V and a state-of-charge $q_b$ of 0.45, the polar coordinates are $r_b$=0.80 and $\theta_b$=46.7°.

The pre-characterized constant C-rate curves are stored in polar coordinate form, and a simple multi-step linear interpolation method is sufficient for determining the effective C-rate. First, the r values of each curve are linearly interpolated at the measured angle $\theta_b$. The r values at $\theta_b$ of the two pre-characterized curves ($r_1$ and $r_2$) that surround the measured $r_b$ are then used to linearly interpolate the C-rate values of the two curves ($C_{rate,1}$ and $C_{rate,2}$) to calculate the effective C-rate $C_{eff,b}$.

$$C_{eff,b} = \frac{(C_{rate,1} - C_{rate,2}) \cdot (r_b - r_2)}{r_1 - r_2} + C_{rate,2} \quad (7)$$

For the given point in FIG. 1, the effective C-rate $C_{eff,b}$ interpolated from the constant-current curves is −0.25 C.

The effective C-rate may be interpreted as the constant charge or discharge current required by a typical cell at 25° C. in order to have the same voltage $V_b$ and state-of-charge $q_b$ as the measured cell. In the case where the measured cell is a typical cell at 25° C. and has been discharging or charging at a constant current, the effective C-rate will be equal to the measured C-rate. By specifying the effective current as a C-rate, the charging current proportionally decreases as the maximum capacity $Q_{max}$ decreases with age.

Figure 2:
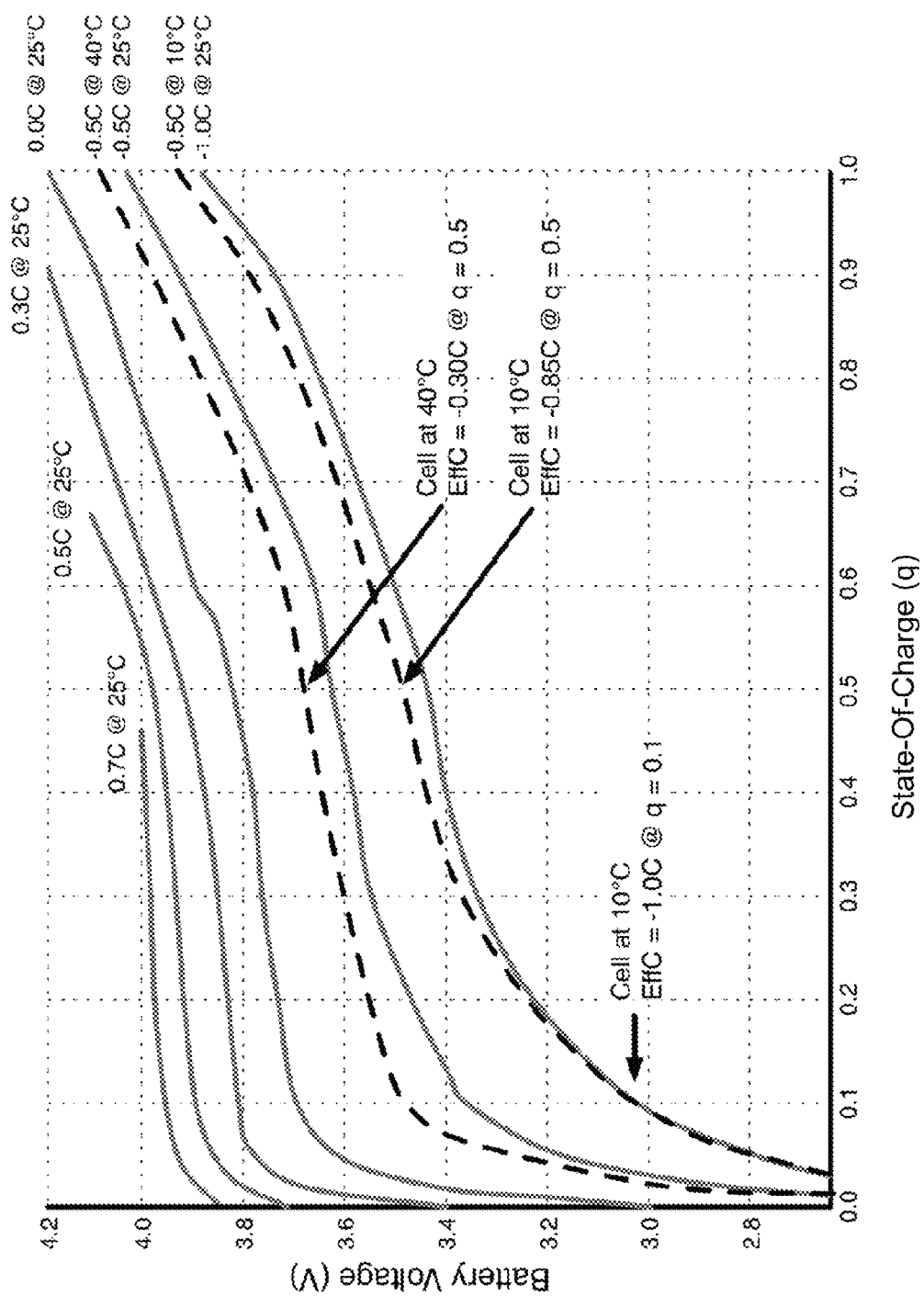
FIG. 2 shows a set of constant-current curves in accordance with the disclosed embodiments.

In addition to adapting to capacity, the effective C-rate also adapts to changes in temperature. For instance, constant-current curves at other temperatures look very similar to the pre-characterized curves at 25° C., but at different currents. FIG. 2 shows the pre-characterized constant-current curves at 25° C. along with −0.5 C discharges at 10° C. and 40° C. The constant curves at the different temperatures look very similar to 25° C. discharge curves at different currents. Lower temperatures slow diffusion and colder constant-current curves shift away from the 0.0 C curve at 25° C. Higher temperatures speed up diffusion and warmer constant-current curves shift closer to the 0.0 C curve at 25° C. For the example in FIG. 2, the equivalent C-rate for the constant −0.5 C discharge at 10° C. at a state-of-charge of 0.5 is about −0.85 C. The equivalent C-rate for the constant −0.5 C discharge at 40° C. at a state-of-charge of 0.5 is about −0.3 C.

Figure 3:
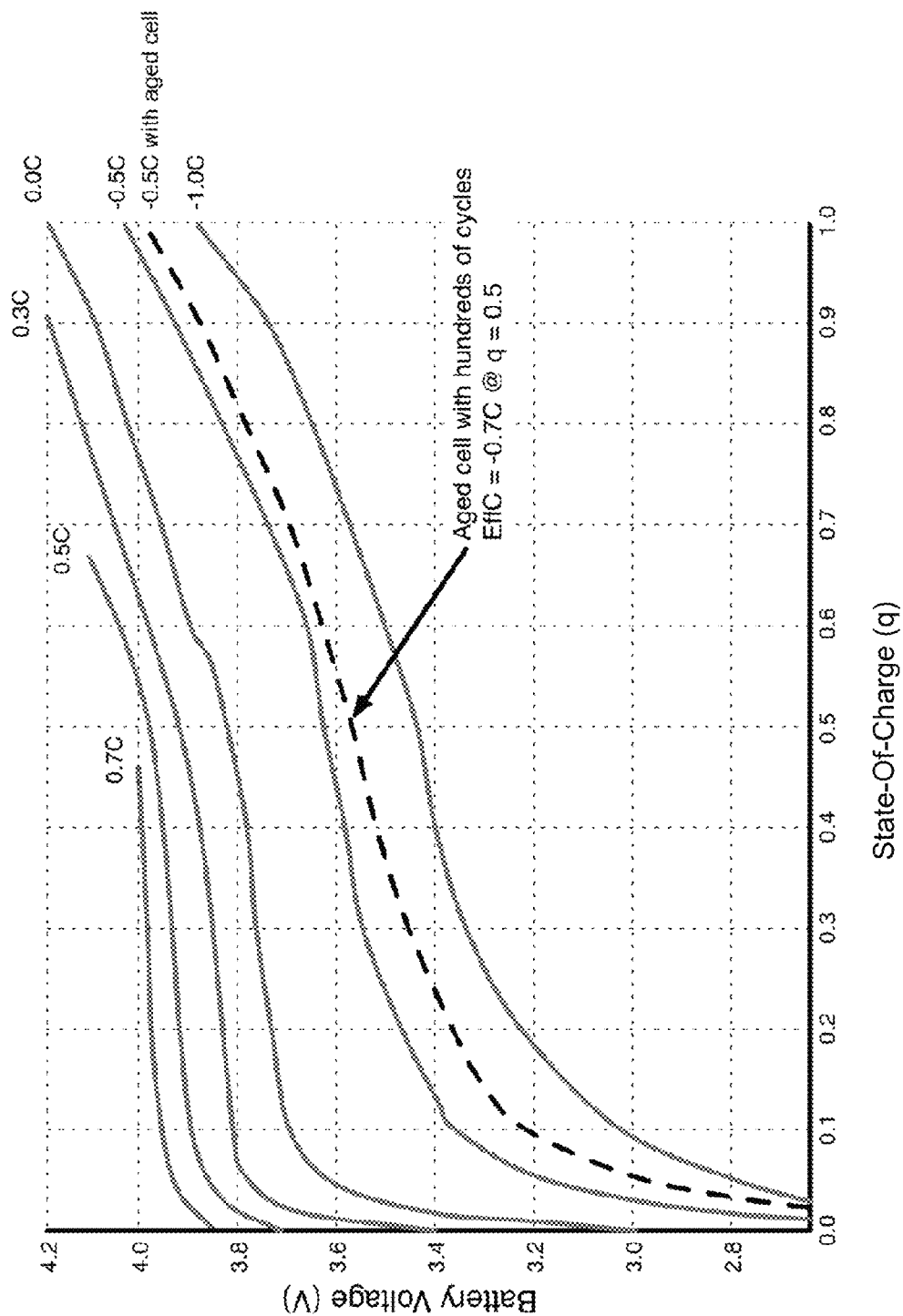
FIG. 3 shows a set of constant-current curves in accordance with the disclosed embodiments.

Similarly, aged cells also show slowed diffusion much like a fresh cell at a colder temperature. FIG. 3 shows a constant current discharge at −0.5 C at 25° C. for a cell that has experienced hundreds of full capacity discharge cycles. The equivalent current for this aged cell is about −0.70 C at a state-of-charge of 0.5. In general, aging causes the discharge curves to shift down and to the right, as long as one corrects properly for $Q_{max}$ fade.

During manufacturing, cell-to-cell differences produce variations in the diffusion rates for otherwise identical cells. Consequently, even fresh cells at 25° C. can show variance from the pre-characterized constant-current curves, and the calculation of their effective C-rates can differ from the measured C-rates.

Notice that not only can the effective C-rate be very different from the measured C-rate, but the effective C-rate can also vary even if the real current is constant, or vice versa. For instance, as shown in FIG. 2, at lower states-of-charge the equivalent C-rate for the −0.5 C constant current discharge at 10° C. moves from −0.85 C to −1.0 C. In other words, real curves may drift from pre-characterized reference curves because the cell is not identical to the reference cell, the cell has aged, the temperature is changing (e.g., due to heating), the current is changing (e.g., because constant power is not constant current), the "cell" is actually a bank of cells in parallel, and/or a balancer is operating.

Figure 4:
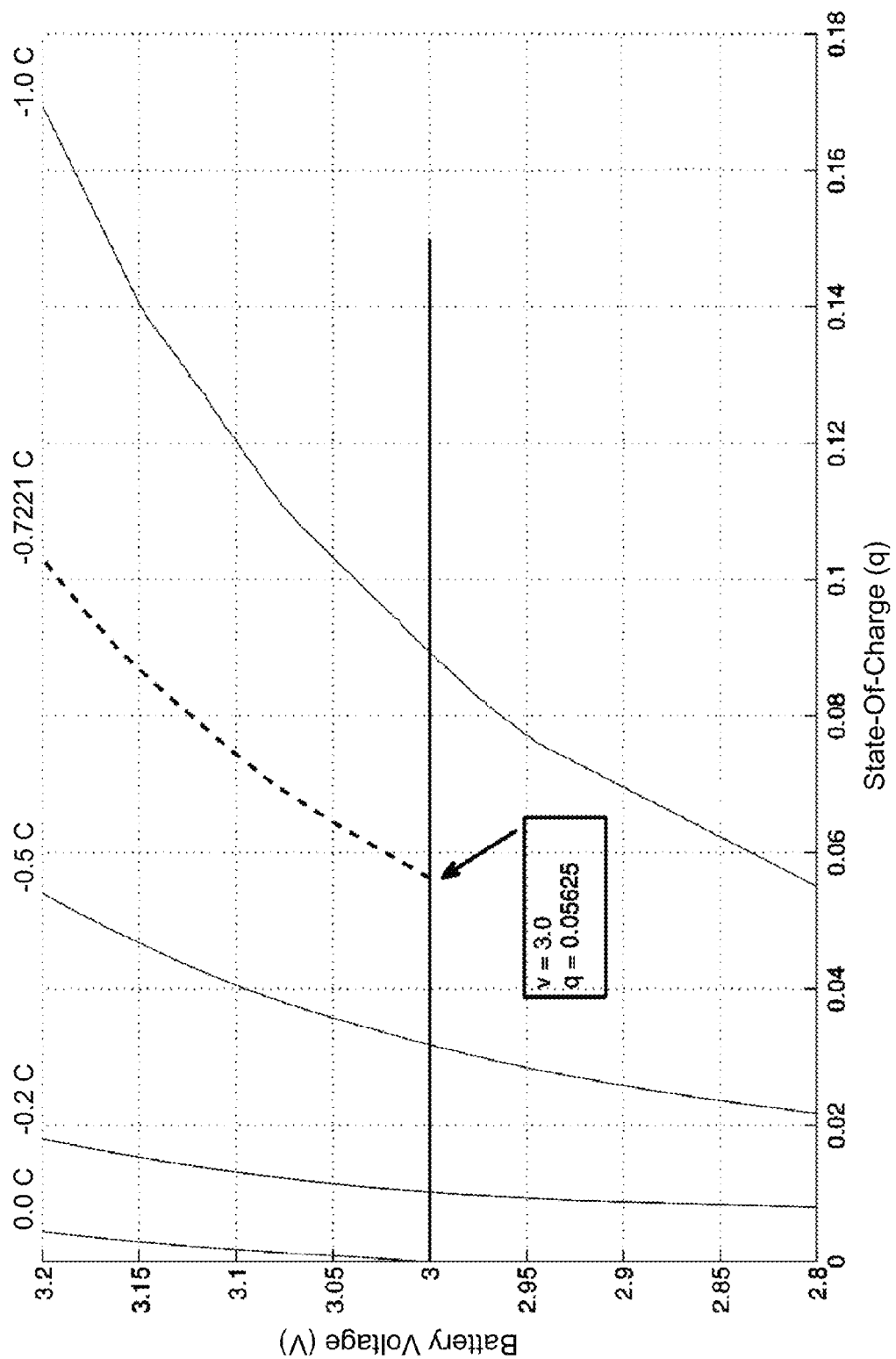
FIG. 4 shows the calculation of a value of an inaccessible capacity of a battery in accordance with the disclosed embodiments.

When charging, the effective C-rate becomes a practical metric that dynamically changes with variations in temperature, aging, and cell-to-cell manufacturing differences. In turn, the effective C-rate may be used to estimate an inaccessible capacity of the battery as the state-of-charge corresponding to an intersection of the discharge curve with a discharge-termination voltage of the battery. As shown in FIG. 4, a battery with an effective C-rate of −0.7221 C may follow a constant-current curve that intersect a 3.0 V line at a state-of-charge of 0.05625. The intersection point may be provided by a pre-computed table and/or piecewise polynomial that give the 3.0 V intersection point for each effective current.

Figure 5:
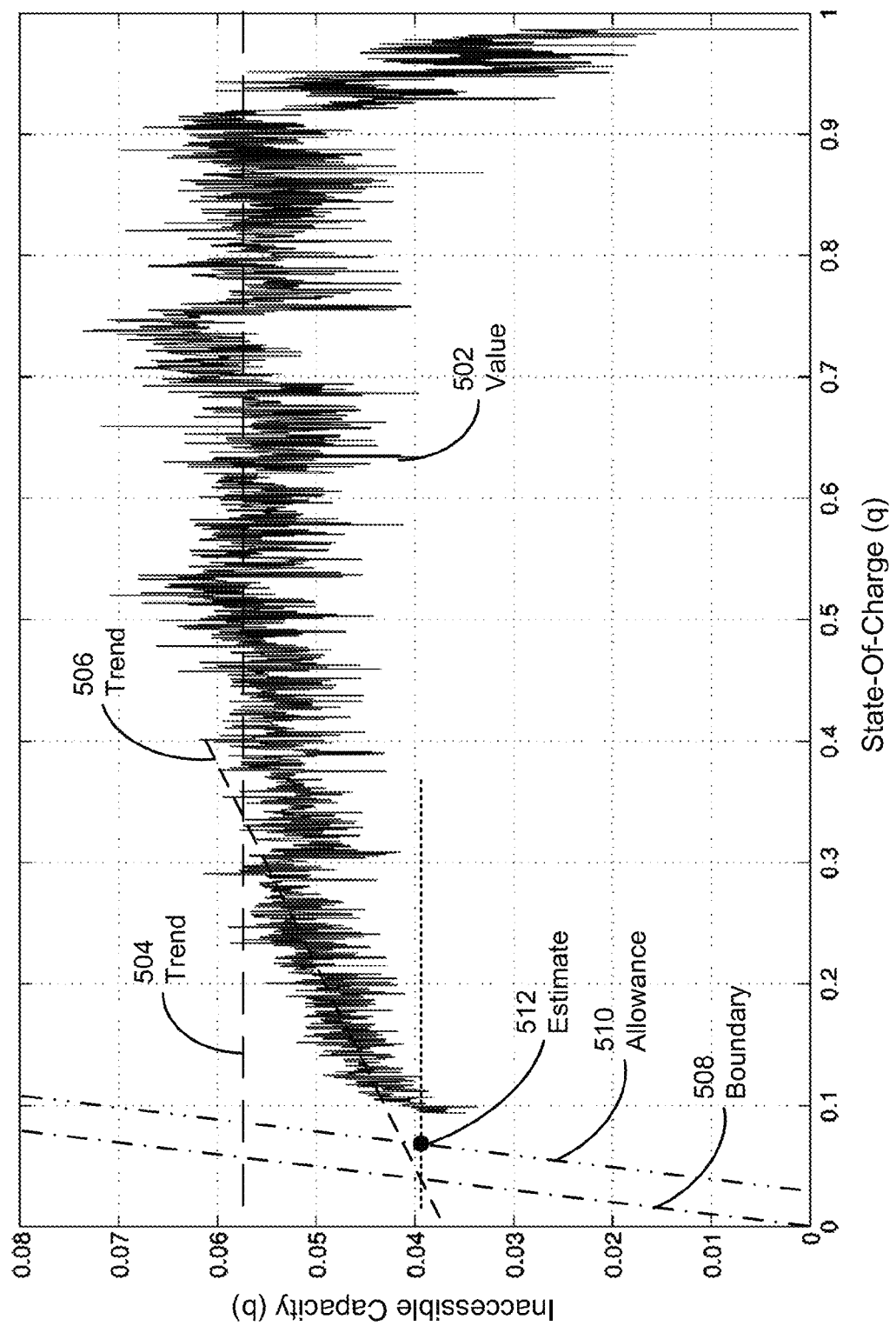
FIG. 5 shows the updating of an inaccessible capacity of a battery based on a trend in the value of the inaccessible capacity in accordance with the disclosed embodiments.

The value of the inaccessible capacity may also be tracked during use (e.g., discharge) of the battery. As shown in FIG. 5, a value 502 of the inaccessible capacity is plotted against the state-of-charge q. Value 502 may be close to a flat line, with some slow drift. One or more trends 504-506 in value 502 are also extrapolated, and an estimate 512 of the inaccessible capacity may be updated based on the trend(s).

Trend 504 may be based on an early extrapolation of value 502, and trend 506 may be based on a later extrapolation of value 502 (e.g., as the state-of-charge decreases during discharge of the battery). An initial update of estimate 512 may be based on the intersection of trend 506 with a 3 V discharge-termination voltage boundary 508 for the battery. In the example of FIG. 5, the intersection point of trend 506 with boundary 508 may produce an initial value of 0.0394 for the inaccessible capacity.

An allowance 510 for hibernation and/or other activities to take place before boundary 508 is reached is then added to produce estimate 512. For example, a 200 mAh "hibernation allowance" may be added to a battery with a $Q_{max}$ of 7.3 Ah, resulting in an increase of 2.74% of the inaccessible capacity to 0.0668, or 488 mAh. Estimate 512 may also be conservative to reduce the likelihood of a brownout and/or unforeseen interruption in use of the portable electronic device.

FIG. 6 shows an exemplary technique for calculating an inaccessible capacity of a battery in accordance with the disclosed embodiments. An interpolator may take q and v as input and return the inaccessible capacity b. It is convenient to do this in two steps: first use a function cqv(q, v) to find which constant-current curve c passes through the point (q, v), and then compute where this curve intersects the 3.0 V line by using a function b=bc(c). The function cqv(q, v) has domain $0 \leq q \leq 1$ and $3.0 \leq v \leq 4.2$. Part of this domain lies above the 0.0 C curve, which corresponds to charging processes. A discharging cell can temporarily have (q, v) values in this region if it has very recently undergone charging. The function needs to return negative values in this region: they don't have to be accurate, but they should be sensible, at least for points close to the 0.0 C curve.

Likewise, the cell could foreseeably experience brief periods where q and v are outside their normal domains. The function should return sensible continuous values in those cases.

As described above, the use of polar coordinates may work well with interpolation. As a result, the voltage range [3.0, 4.2] may be scaled to the interval [0, 1] by writing v=3.0+1.2u, and the curves may be plotted using a polar coordinate system centered at (q=1, v=3.0). One can then safely interpolate along the r coordinate.

The constant-current curves can be converted in advance to polar form, and stored in the battery-management unit (BMU) for the battery as vectors or piecewise linear polynomials r=r(θ, c) for each constant C-rate c. Conversion to polar coordinates does require calculation of a square root and an inverse trigonometric function, but standard efficient techniques for these are available. The fidelity of the reference curve representation and the amount of computation in the BMU will need to be adjusted to meet the space and performance profile of the BMU processor.

As mentioned above, a "stream" of inaccessible capacity values may be projected forward to estimate the state-of-charge when the cell voltage reaches 3.0 V. An exemplary technique for performing such estimation is shown in FIGS. 7A-7D.

During discharge, the estimation technique tracks instantaneous reserve values vs. q and extrapolates any trends as the discharge proceeds. It does this by recording values at "milepost" q-points to build up a coarse-grained picture of the smoothed discharge history. It then uses the most recent parts of this picture to take any trends into account when estimating the best value for the inaccessible capacity. This particular version is fairly conservative: it only looks for linear trends, applies them if they tend to increase the estimate, and does not project further ahead than rules of thumb about extrapolation would advise.

Data used for the estimation technique is shown in FIG. 7A, and initialization of the technique at the start of every discharge is shown in FIG. 7B. Every second during discharge, a new sample (q, y) is incorporated, as shown in FIG. 7C. As shown in FIG. 7D, the technique can make a prediction for the inaccessible capacity at any time by taking into account recent trends, as recorded in the mileposts in its discharge trail.

Figure 8:
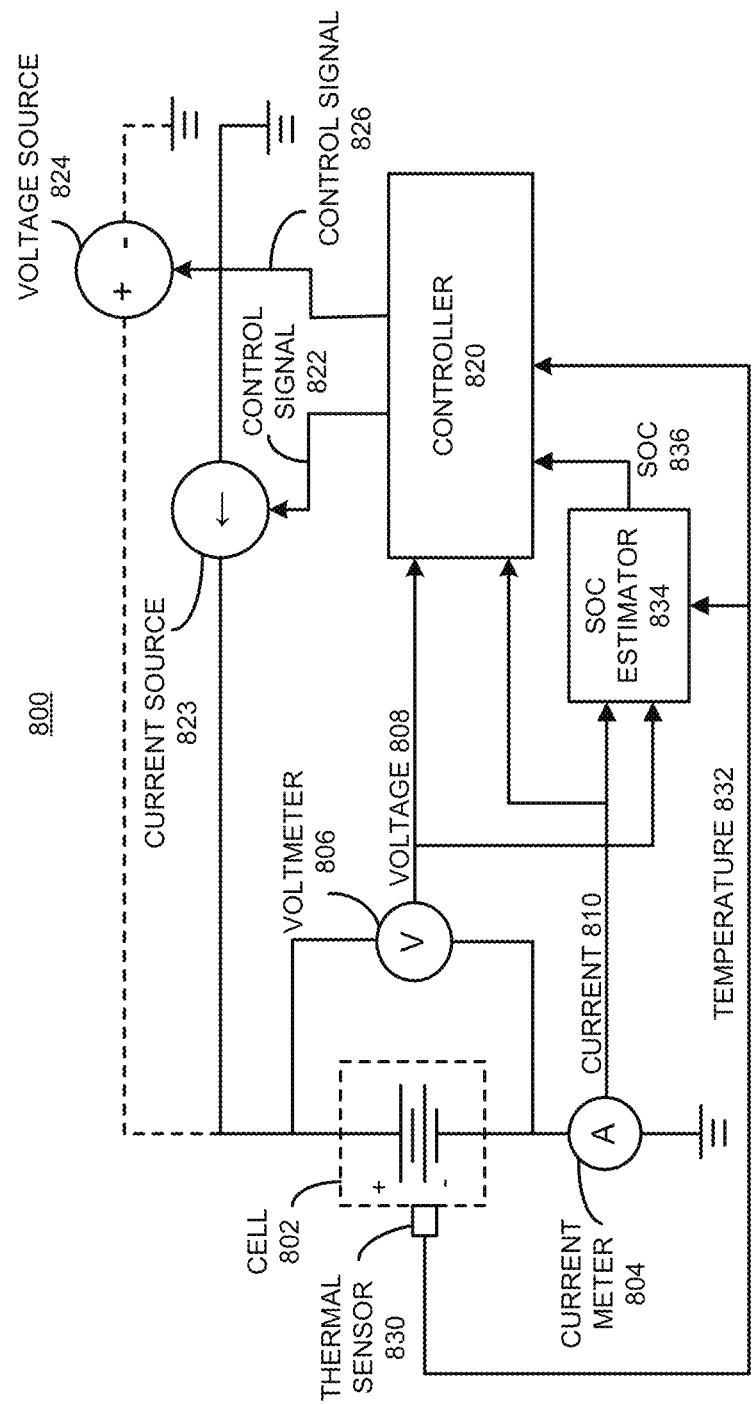
FIG. 8 shows a system for managing use of a battery in a portable electronic device in accordance with the disclosed embodiments.

FIG. 8 shows a system for managing use of a battery 800 in a portable electronic device. Battery 800 includes a battery cell 802. It also includes a current meter (current sensor) 804, which measures a charging current applied to cell 802, and a voltmeter (voltage sensor) 806, which measures a voltage across cell 802. Battery 800 also includes a thermal sensor 830, which measures the temperature of battery cell 802. (Note that numerous possible designs for current meters, voltmeters and thermal sensors are well known in the art.)

Battery 800 also includes a current source 823, which provides a controllable constant charging current (with a varying voltage), or alternatively, a voltage source 824, which provides a controllable constant charging voltage (with a varying current).

The charging process is controlled by a controller 820, which receives: a voltage signal 808 from voltmeter 806, a current signal 810 from current meter 804, a temperature signal 832 from thermal sensor 830, and/or a state-of-charge (SOC) value 836 from a SOC estimator 834. These inputs are used to generate a control signal 822 for current source 823, or alternatively, a control signal 826 for voltage source 824.

During operation, SOC estimator 834 receives a voltage 808 from voltmeter 806, a current from current meter 804 and a temperature from thermal sensor 830 and outputs SOC value 836.

Note that controller 820 can be implemented using either a combination of hardware and software or purely hardware. In one embodiment, controller 820 is implemented using a microcontroller, which includes a microprocessor that executes instructions that control the charging process.

In addition to controlling the charging process, the system of FIG. 8 can also estimate an inaccessible capacity of battery 800. The system may include a monitoring apparatus that obtains a voltage of the battery and a state-of-charge of the battery, calculates an effective C-rate of the battery using the voltage and the state-of-charge, and uses the effective C-rate to estimate an inaccessible capacity of the battery. The system may also include a management apparatus that manages use of the battery with the portable electronic device based on the inaccessible capacity.

Figure 9:
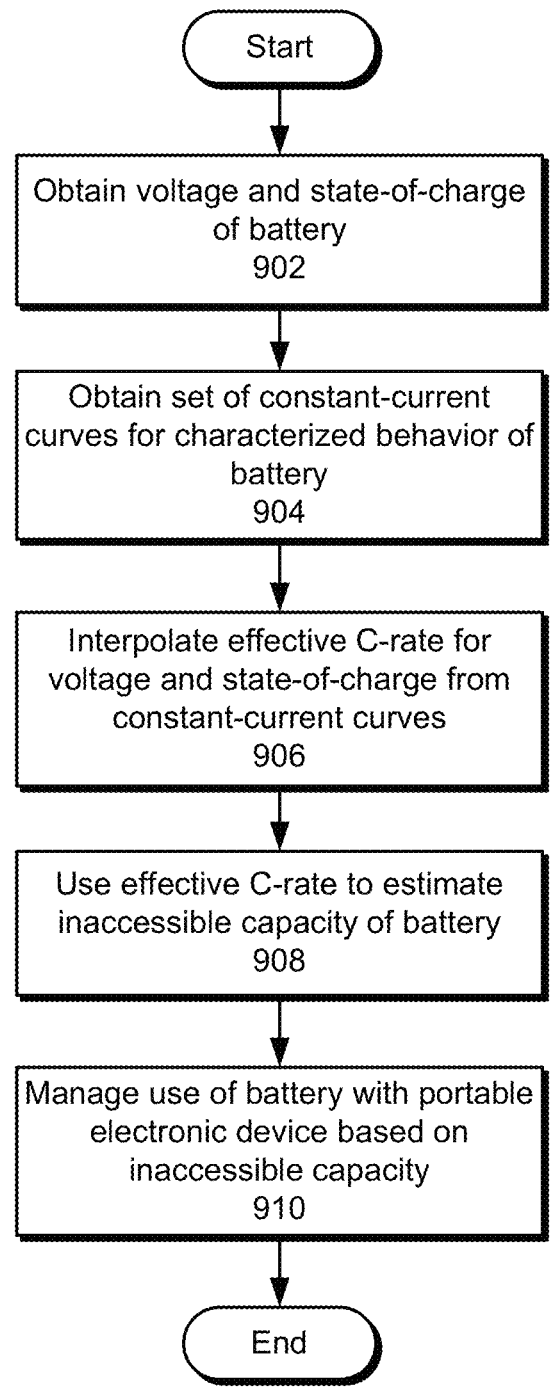
FIG. 9 shows a flowchart illustrating the process of managing use of a battery in accordance with the disclosed embodiments.

FIG. 9 shows a flowchart illustrating the process of managing use of a battery in a portable electronic device in accordance with the disclosed embodiments. In one or more embodiments, one or more of the steps may be omitted, repeated, and/or performed in a different order. Accordingly, the specific arrangement of steps shown in FIG. 9 should not be construed as limiting the scope of the embodiments.

Initially, a voltage and state-of-charge of the battery are obtained (operation 902). The voltage may be measured from the battery, and the state-of-charge may be calculated using a coulomb-counting technique. Next, an effective C-rate of the battery is calculated using the voltage and the state-of-charge.

In particular, a set of constant-current curves for a characterized behavior of the battery are obtained (operation 904), and the effective C-rate for the voltage and state-of-charge is interpolated from the constant-current curves (operation 906). For example, one or more charge and/or discharge curves for a given temperature (e.g., 25° C.) and/or age (e.g., fresh) of the battery may be parameterized, and the battery's voltage and state-of-charge is mapped to a "point" on a parameterized charge and/or discharge curve for a certain C-rate of the battery at the given temperature and/or age.

The effective C-rate is then used to estimate an inaccessible capacity of the battery (operation 908), as described below with respect to FIG. 10. Finally, use of the battery with the portable electronic device is managed based on the inaccessible capacity (operation 910). First, the state-of-charge may be reported to a user of the portable electronic device based on the inaccessible capacity. For example, the state-of-charge may be scaled down based on the inaccessible capacity to provide a more realistic, conservative, and/or predictive estimate of the remaining capacity in the battery to the user. Second, the inaccessible capacity may be used to provide an upper limit on the effective C-rate to the portable electronic device. The upper limit may represent the maximum amount of current that can be drawn from the battery without causing a brownout.

Figure 10:
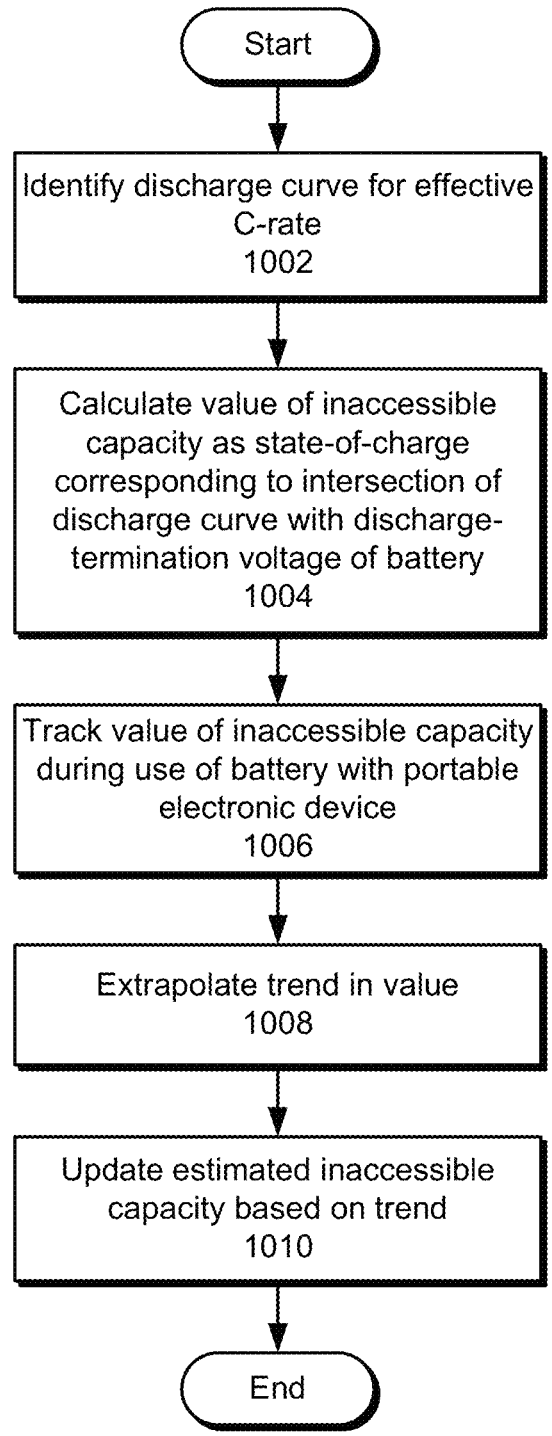
FIG. 10 shows a flowchart illustrating the process of using an effective C-rate to estimate the inaccessible capacity of a battery in accordance with the disclosed embodiments.

FIG. 10 shows a flowchart illustrating the process of using an effective C-rate to estimate the inaccessible capacity of a battery in accordance with the disclosed embodiments. In one or more embodiments, one or more of the steps may be omitted, repeated, and/or performed in a different order. Accordingly, the specific arrangement of steps shown in FIG. 10 should not be construed as limiting the scope of the embodiments.

First, a discharge curve for the effective C-rate is identified (operation 1002). As discussed above, the discharge curve may be interpolated from a set of constant-current curves for a characterized behavior of the battery. Next, a value of the inaccessible capacity is calculated as the state-of-charge corresponding to an intersection of the discharge curve with a discharge-termination voltage of the battery (operation 1004). For example, the inaccessible capacity may be obtained as the state-of-charge at the point at which the discharge curve intersects the 3.0 V line in voltage/state-of-charge space.

The value of the inaccessible capacity is also tracked during use of the battery with the portable electronic device (operation 1006), and a trend in the value is extrapolated (operation 1008). For example, values of the inaccessible capacity and states-of-charge of the battery may be recorded during discharge of the battery and processed to determine a linear trend associated with the values and states-of-charge.

Finally, the estimated inaccessible capacity is updated based on the trend (operation 1010). The update may be conservative to avert loss of data and/or other issues associated with reduction and/or loss of battery power. As a result, the trend may be included in the estimated inaccessible capacity if the trend increases the value of the inaccessible capacity. Alternatively, the estimated inaccessible capacity may be increased after the trend is included and/or independently of the trend. For example, the inaccessible capacity may be increased by a hibernation allowance, a predefined value (e.g., independently of inclusion of the trend in the estimate), a slope associated with the trend (e.g., if the slope increases the inaccessible capacity), and/or a modification to the slope (e.g., to increase the inaccessible capacity).

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for managing use of a battery in a portable electronic device, comprising:
   using a monitoring apparatus to:
      obtain a voltage of the battery and a state-of-charge of the battery;
      calculate an effective C-rate of the battery using the voltage and the state-of-charge, the effective C-rate representing a constant current that would cause a reference battery to have the same voltage and state of charge as the battery; and
      use the effective C-rate to estimate an inaccessible capacity of the battery; and
   using a management apparatus to manage use of the battery with the portable electronic device based on the inaccessible capacity.

2. The computer-implemented method of claim 1, wherein using the monitoring apparatus to calculate the effective C-rate of the battery using the voltage and the state-of-charge involves:
   obtaining a set of constant-current curves for a characterized behavior of the battery; and
   interpolating the effective C-rate for the voltage and the state-of-charge from the set of constant-current curves.

3. The computer-implemented method of claim 2, wherein the set of constant-current curves comprises at least one of:
   one or more charge curves; and
   one or more discharge curves.

4. The computer-implemented method of claim 3, wherein using the monitoring apparatus to use the effective C-rate to estimate the inaccessible capacity of the battery involves:
   identifying, from the one or more discharge curves, a discharge curve for the effective C-rate; and
   calculating a value of the inaccessible capacity as the state-of-charge corresponding to an intersection of the discharge curve with a discharge-termination voltage of the battery.

5. The computer-implemented method of claim 4, wherein using the monitoring apparatus to use the effective C-rate to estimate the inaccessible capacity of the battery further involves:
   tracking the value of the inaccessible capacity during use of the battery with the portable electronic device;
   extrapolating a trend in the value; and
   updating the estimated inaccessible capacity based on the trend.

6. The computer-implemented method of claim 5, wherein updating the estimated inaccessible capacity based on the trend involves at least one of:

including the trend in the estimated inaccessible capacity if the trend increases the value of the inaccessible capacity;
increasing the estimated inaccessible capacity after the trend is included; and
increasing the estimated inaccessible capacity independently of the trend.

7. The computer-implemented method of claim 6, wherein the estimated inaccessible capacity is increased by at least one of:
a hibernation allowance;
a predefined value;
a slope associated with the trend; and
a modification to the slope.

8. The computer-implemented method of claim 1, wherein using a management apparatus to manage use of the battery with the portable electronic device based on the inaccessible capacity involves at least one of:
reporting the state-of-charge to a user of the portable electronic device based on the inaccessible capacity; and
using the inaccessible capacity to provide an upper limit on the effective C-rate to the portable electronic device.

9. A system for managing use of a battery in a portable electronic device, comprising:
a monitoring apparatus configured to:
obtain a voltage of the battery and a state-of-charge of the battery;
calculate an effective C-rate of the battery using the voltage and the state-of-charge, the effective C-rate representing a constant current that would cause a reference battery to have the same voltage and state of charge as the battery; and
use the effective C-rate to estimate an inaccessible capacity of the battery; and
a management apparatus configured to manage use of the battery with the portable electronic device based on the inaccessible capacity.

10. The system of claim 9, wherein calculating the effective C-rate of the battery using the voltage and the state-of-charge involves:
obtaining a set of constant-current curves for a characterized behavior of the battery; and
interpolating the effective C-rate for the voltage and the state-of-charge from the set of constant-current curves.

11. The system of claim 10, wherein using the effective C-rate to estimate the inaccessible capacity of the battery involves:
identifying, from the set of constant-current curves, a discharge curve for the effective C-rate; and
calculating a value of the inaccessible capacity as the state-of-charge corresponding to an intersection of the discharge curve with a discharge-termination voltage of the battery.

12. The system of claim 11, wherein using the effective C-rate to estimate the inaccessible capacity of the battery further involves:
tracking the value of the inaccessible capacity during use of the battery with the portable electronic device;
extrapolating a trend in the value; and
updating the estimated inaccessible capacity based on the trend.

13. The system of claim 12, wherein updating the estimated inaccessible capacity based on the trend involves at least one of:
including the trend in the estimated inaccessible capacity if the trend increases the value of the inaccessible capacity;
increasing the estimated inaccessible capacity after the trend is included; and
increasing the estimated inaccessible capacity independently of the trend.

14. The system of claim 9, wherein managing use of the battery with the portable electronic device based on the inaccessible capacity involves at least one of:
reporting the state-of-charge to a user of the portable electronic device based on the inaccessible capacity; and
using the inaccessible capacity to provide an upper limit on the effective C-rate to the portable electronic device.

15. A computer-readable storage medium storing instructions that when executed by a computer cause the computer to perform a method for managing use of a battery in a portable electronic device, the method comprising:
using a monitoring apparatus to:
obtain a voltage of the battery and a state-of-charge of the battery;
calculate an effective C-rate of the battery using the voltage and the state-of-charge, the effective C-rate representing a constant current that would cause a reference battery to have the same voltage and state of charge as the battery; and
use the effective C-rate to estimate an inaccessible capacity of the battery; and
using a management apparatus to manage use of the battery with the portable electronic device based on the inaccessible capacity.

16. The computer-readable storage medium of claim 15, wherein using a monitoring apparatus to calculate the effective C-rate of the battery using the voltage and the state-of-charge involves:
obtaining a set of constant-current curves for a characterized behavior of the battery; and
interpolating the effective C-rate for the voltage and the state-of-charge from the set of constant-current curves.

17. The computer-readable storage medium of claim 16, wherein using the monitoring apparatus to use the effective C-rate to estimate the inaccessible capacity of the battery involves:
identifying, from the set of constant-current curves, a discharge curve for the effective C-rate; and
calculating a value of the inaccessible capacity as the state-of-charge corresponding to an intersection of the discharge curve with a discharge-termination voltage of the battery.

18. The computer-readable storage medium of claim 17, wherein using the monitoring apparatus to use the effective C-rate to estimate the inaccessible capacity of the battery further involves:
tracking the value of the inaccessible capacity during use of the battery with the portable electronic device;
extrapolating a trend in the value; and
updating the estimated inaccessible capacity based on the trend.

19. The computer-readable storage medium of claim 18, wherein updating the estimated inaccessible capacity based on the trend involves at least one of:
including the trend in the estimated inaccessible capacity if the trend increases the value of the inaccessible capacity;
increasing the estimated inaccessible capacity after the trend is included; and increasing the estimated inaccessible capacity independently of the trend.

20. The computer-readable storage medium of claim 15, wherein using a management apparatus to manage use of the battery with the portable electronic device based on the inaccessible capacity involves at least one of:
reporting the state-of-charge to a user of the portable electronic device based on the inaccessible capacity; and
using the inaccessible capacity to provide an upper limit on the effective C-rate to the portable electronic device.

\* \* \* \* \*